(12) United States Patent
Cheng et al.

(10) Patent No.: US 10,177,191 B1
(45) Date of Patent: Jan. 8, 2019

(54) IMAGE SENSOR DEVICE AND METHOD FOR FORMING THE SAME

(71) Applicant: Taiwan Semiconductor Manufacturing Co., Ltd., Hsinchu (TW)

(72) Inventors: Yun-Wei Cheng, Taipei (TW); Chun-Hao Chou, Tainan (TW); Kuo-Cheng Lee, Tainan (TW); Hsun-Ying Huang, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/821,975

(22) Filed: Nov. 24, 2017

(51) Int. Cl.
| | |
|---|---|
| *H01L 21/66* | (2006.01) |
| *H01L 31/02* | (2006.01) |
| *H01L 27/146* | (2006.01) |
| *H01L 29/08* | (2006.01) |
| *H01L 29/66* | (2006.01) |

(52) U.S. Cl.
CPC .... *H01L 27/14643* (2013.01); *H01L 27/1463* (2013.01); *H01L 27/14605* (2013.01); *H01L 27/14612* (2013.01); *H01L 27/14623* (2013.01); *H01L 27/14632* (2013.01); *H01L 27/14685* (2013.01); *H01L 27/14687* (2013.01); *H01L 27/14689* (2013.01); *H01L 29/0847* (2013.01); *H01L 29/66568* (2013.01); *H01L 27/14621* (2013.01); *H01L 27/14627* (2013.01); *H01L 27/14636* (2013.01)

(58) Field of Classification Search
CPC ..... H01L 27/14; H01L 27/144; H01L 27/146; H01L 27/1463
See application file for complete search history.

(56) References Cited

U.S. PATENT DOCUMENTS

| | | | |
|---|---|---|---|
| 2014/0264719 A1* | 9/2014 | Chou | H01L 21/76229 257/506 |
| 2016/0223808 A1* | 8/2016 | Brinkley | G02B 26/023 |
| 2016/0268220 A1* | 9/2016 | Tsai | H01L 27/14643 |
| 2017/0194583 A1* | 7/2017 | Yun | H01L 27/283 |

* cited by examiner

*Primary Examiner* — Changhyun Yi
(74) *Attorney, Agent, or Firm* — Birch, Stewart, Kolasch & Birch, LLP

(57) ABSTRACT

A method for forming an image sensor device is provided. The method includes providing a substrate. The substrate has a front surface and a back surface, and the substrate has a light-receiving region and a device region. The method includes forming a first transistor and a first source/drain structure respectively in the light-receiving region and the device region. The first transistor includes a first gate structure, a light-sensing structure, a second source/drain structure, the first gate structure is over the front surface, the light-sensing structure and the second source/drain structure are formed in the substrate and are respectively located at opposite first sides of the first gate structure, the first source/drain structure is formed in the substrate, and the first source/drain structure is electrically connected to the second source/drain structure. The method includes forming a light-blocking layer over the back surface.

20 Claims, 15 Drawing Sheets

IMAGE SENSOR DEVICE AND METHOD FOR FORMING THE SAME

BACKGROUND

The semiconductor integrated circuit (IC) industry has experienced rapid growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component that can be created using a fabrication process) has decreased. Such advances have increased the complexity of processing and manufacturing ICs. For these advances, similar developments in IC processing and manufacturing are needed.

Along with the advantages realized from reducing geometric size, improvements are being made directly to the IC devices. One such IC device is an image sensor device. An image sensor device includes a pixel array (or grid) for detecting light and recording intensity (brightness) of the detected light. The pixel array responds to the light by accumulating a charge. The higher the light intensity, the greater the charge that is accumulated in the pixel array. The accumulated charge is then used (for example, by other circuitry) to provide image information for use in a suitable application, such as a digital camera.

However, since the feature sizes continue to decrease, fabrication processes continue to become more difficult to perform. Therefore, it is a challenge to form reliable image sensor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIG. 1A-1 is a cross-sectional view illustrating the image sensor device along a sectional line I-I' in FIG. 1A, in accordance with some embodiments.

FIG. 1A-2 is a cross-sectional view illustrating the image sensor device along a sectional line II-II' in FIG. 1A, in accordance with some embodiments.

FIG. 1A-3 is a cross-sectional view illustrating the image sensor device along a sectional line III-III' in FIG. 1A, in accordance with some embodiments.

FIG. 1B-1 is a cross-sectional view illustrating the image sensor device along a sectional line I-I' in FIG. 1B, in accordance with some embodiments.

FIG. 1B-2 is a cross-sectional view illustrating the image sensor device along a sectional line II-II' in FIG. 1B, in accordance with some embodiments.

FIG. 1C-1 is a cross-sectional view illustrating the image sensor device along a sectional line I-I' in FIG. 1C, in accordance with some embodiments.

FIG. 1D-1 is a cross-sectional view illustrating the image sensor device along a sectional line I-I' in FIG. 1D, in accordance with some embodiments.

FIG. 1E-1 is a cross-sectional view illustrating the image sensor device along a sectional line I-I' in FIG. 1E, in accordance with some embodiments.

FIG. 2 is a cross-sectional view illustrating an image sensor device, in accordance with some embodiments.

FIG. 3 is a cross-sectional view illustrating an image sensor device, in accordance with some embodiments.

DETAILED DESCRIPTION

Figure 1A:
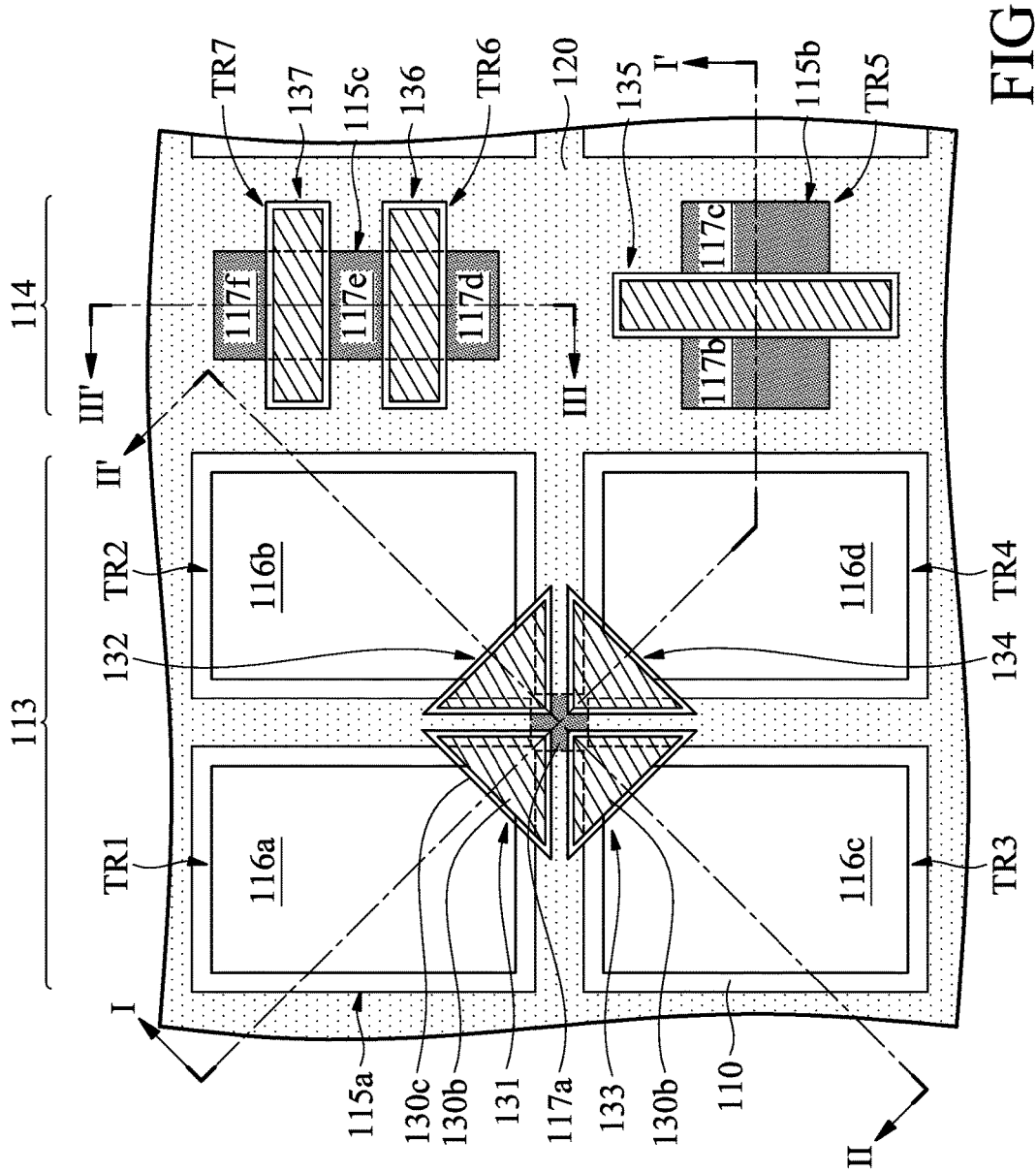
FIGS. 1A-1E are top views of various stages of a process for forming an image sensor device, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Figures 1, 1A:
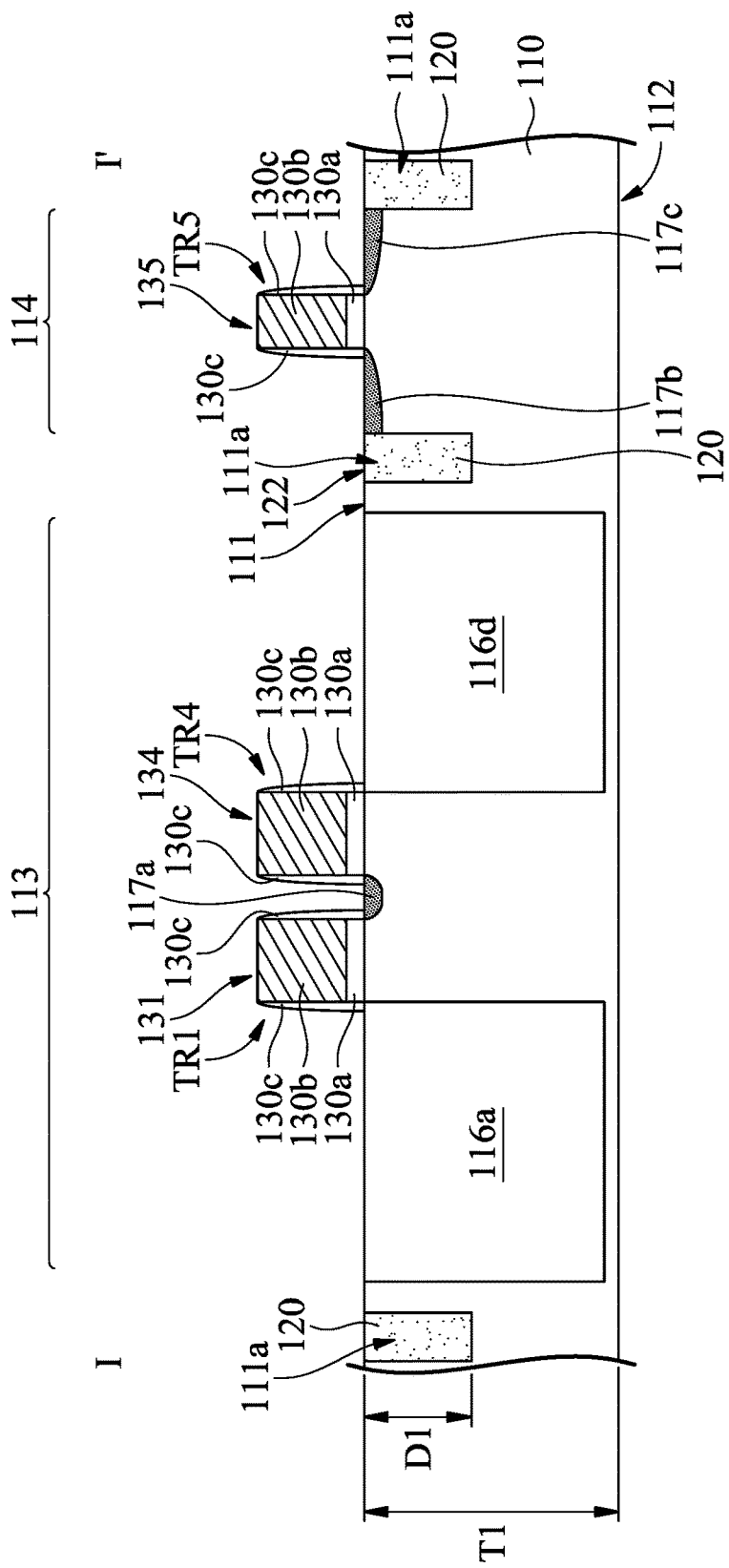
Figures 1, 1A, 2, 3:
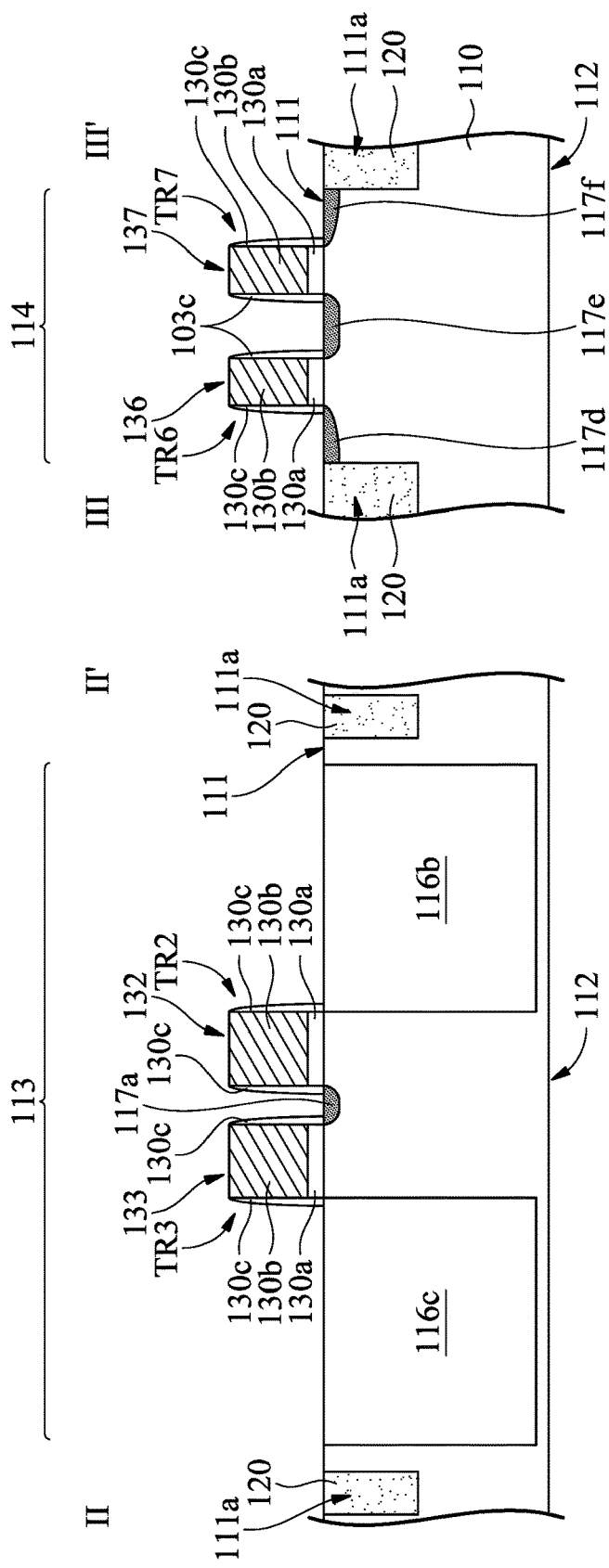

FIGS. 1A-1E are top views of various stages of a process for forming an image sensor device, in accordance with some embodiments. FIG. 1A-1 is a cross-sectional view illustrating the image sensor device along a sectional line I-I' in FIG. 1A, in accordance with some embodiments. FIG. 1A-2 is a cross-sectional view illustrating the image sensor device along a sectional line II-II' in FIG. 1A, in accordance with some embodiments.

As shown in FIGS. 1A, 1A-1, and 1A-2, a substrate 110 is provided, in accordance with some embodiments. The substrate 110 has a front surface 111 and a back surface 112 opposite to the front surface 111, in accordance with some embodiments. The substrate 110 has a light-receiving region 113 and a device region 114, in accordance with some embodiments. The substrate 110 has a thickness T1, in accordance with some embodiments. The thickness T1 is equal to a distance between the front surface 111 and the back surface 112, in accordance with some embodiments.

In some embodiments, the substrate 110 is a bulk semiconductor substrate, such as a semiconductor wafer. For example, the substrate 110 is a silicon wafer. The substrate 110 may include silicon or another elementary semiconductor material such as germanium. In some other embodiments, the substrate 110 includes a compound semiconductor. The compound semiconductor may include silicon germanium, gallium arsenide, silicon carbide, indium arsenide, indium phosphide, another suitable compound semiconductor, or a combination thereof.

The substrate 110 may be a silicon substrate doped with a P-type dopant such as boron, in which case the substrate 110 is a P-type substrate. Alternatively, the substrate 110 could be another suitable semiconductor material. For example, the substrate 110 may be a silicon substrate doped with an N-type dopant such as phosphorous or arsenic, in which case the substrate is an N-type substrate.

FIG. 1A-3 is a cross-sectional view illustrating the image sensor device along a sectional line III-III' in FIG. 1A, in accordance with some embodiments. As shown in FIGS. 1A-1, 1A-2, and 1A-3, a portion of the substrate 110 is removed to form a trench 111a in the substrate 110, in accordance with some embodiments.

The trench 111a extends from the front surface 111 into the substrate 110, in accordance with some embodiments. The trench 111a surrounds portions of the substrate 110, in accordance with some embodiments. The trench 111a has a depth D1, in accordance with some embodiments. In some embodiments, a ratio of the depth D1 to the thickness T1 ranges from about 0.02 to about 0.5.

As shown in FIGS. 1A, 1A-1, 1A-2, and 1A-3, an isolation structure 120 is formed in the trench 111a, in accordance with some embodiments. The isolation structure 120 extends from the front surface 111 into the substrate 110, in accordance with some embodiments. The isolation structure 120 is filled in the trench 111a, in accordance with some embodiments.

The isolation structure 120 surrounds portions 115a, 115b, and 115c of the substrate 110 to separate the portions 115a, 115b, and 115c from each other, in accordance with some embodiments. The portion 115a is in the light-receiving region 113, in accordance with some embodiments. The portions 115b and 115c are in the device region 114, in accordance with some embodiments.

The isolation structure 120 is made of an insulating material, such as silicon dioxide, silicon nitride, silicon oxynitride, fluoride-doped silicate glass (FSG), a low-K dielectric material or a combination thereof. The isolation structure 120 is formed using a deposition process and a chemical mechanical polishing process, in accordance with some embodiments. The deposition process includes a chemical vapor deposition process, a physical vapor deposition process, or another suitable deposition process. In some embodiments, a top surface 122 of the isolation structure 120 and the front surface 111 are coplanar.

As shown in FIGS. 1A, 1A-1, and 1A-2, light-sensing structures 116a, 116b, 116c, and 116d are formed in the portion 115a, in accordance with some embodiments. The light-sensing structures 116a, 116b, 116c, and 116d are spaced apart from each other, in accordance with some embodiments. In some embodiments, the light-sensing structures 116a, 116b, 116c, and 116d are configured to sense (or detect) light.

The light-sensing structures 116a, 116b, 116c, and 116d may be doped regions having n-type and/or p-type dopants formed in the substrate 110. The light-sensing structures 116a, 116b, 116c, and 116d may be formed by an ion implantation process, diffusion process, or other applicable processes.

As shown in FIGS. 1A, 1A-1, 1A-2, and 1A-3, gate structures 131, 132, 133, 134, 135, 136, and 137 are formed over the front surface 111, in accordance with some embodiments. Each of the gate structures 131, 132, 133, 134, 135, 136, and 137 has a gate dielectric layer 130a and a gate electrode 130b over the gate dielectric layer 130a, in accordance with some embodiments.

The gate dielectric layer 130a is made of a dielectric material, such as a high dielectric constant (high-k) material. The high-k material includes metal oxides, metal nitrides, metal silicates, transition metal-oxides, transition metal-nitrides, transition metal-silicates, oxynitrides of metals, other suitable materials, or a combination thereof, in accordance with some embodiments. The high-k material includes hafnium oxide (HfO$_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), or a combination thereof.

The gate dielectric layer 130a is formed by a deposition process, such as atomic layer deposition (ALD), chemical vapor deposition (CVD), physical vapor deposition (PVD), sputtering, plating, another suitable process, or a combination thereof, in accordance with some embodiments. In some embodiments, the gate dielectric layer 130a needs to be further annealed.

The gate electrode 130b is made of polysilicon, in accordance with some embodiments. In some other embodiments, the gate electrode 130b is made of a suitable metal material, such as aluminum, tungsten, gold, platinum, cobalt, another suitable metal, an alloy thereof, or a combination thereof, in accordance with some embodiments.

In some embodiments, each of the gate structures 131, 132, 133, 134, 135, 136, and 137 further has a spacer layer 130c surrounding the gate dielectric layer 130a and the gate electrode 130b. The spacer layer 130c is made of an insulating material, such as silicon dioxide or silicon nitride.

The gate structures 131, 132, 133, and 134 are formed over the portion 115a, in accordance with some embodiments. The gate structures 131, 132, 133, and 134 are respectively adjacent to (or directly over) the light-sensing structures 116a, 116b, 116c, and 116d, in accordance with some embodiments. The gate structures 131, 132, 133, and 134 are also referred to as transfer gate structures, in accordance with some embodiments.

The gate structure 135 is formed over the portion 115b, in accordance with some embodiments. The gate structure 135 extends across the portion 115b, in accordance with some embodiments. The gate structures 136 and 137 are formed over the portion 115c, in accordance with some embodiments. The gate structures 136 and 137 extend across the portion 115c, in accordance with some embodiments.

As shown in FIGS. 1A, 1A-1, 1A-2, and 1A-3, source/drain structures 117a, 117b, 117c, 117d, 117e, and 117f are formed in the substrate 110, in accordance with some embodiments. The source/drain structure 117a is formed in the portion 115a and between the gate structures 131, 132, 133, and 134, in accordance with some embodiments.

The gate structure 131, the source/drain structure 117a, and the light-sensing structure 116a together form a transistor TR1, in accordance with some embodiments. The gate structure 132, the source/drain structure 117a, and the light-sensing structure 116b together form a transistor TR2, in accordance with some embodiments.

The gate structure 133, the source/drain structure 117a, and the light-sensing structure 116c together form a transistor TR3, in accordance with some embodiments. The gate structure 134, the source/drain structure 117a, and the light-sensing structure 116d together form a transistor TR4, in accordance with some embodiments. That is, the transistors TR1, TR2, TR3, and TR4 share the source/drain structure 117a, in accordance with some embodiments.

The source/drain structures 117b and 117c are formed in the portion 115b, in accordance with some embodiments. The source/drain structures 117b and 117c are respectively located at opposite sides of the gate structure 135, in accordance with some embodiments. The gate structure 135 and the source/drain structures 117b and 117c together form a reset transistor TR5, in accordance with some embodiments.

The source/drain structures 117d, 117e, and 117f are formed in the portion 115c, in accordance with some embodiments. The gate structure 136 is between the source/drain structures 117d and 117e, in accordance with some embodiments. The gate structure 136 and the source/drain structures 117d and 117e together form a source-follower transistor TR6, in accordance with some embodiments. The source-follower transistor TR6 is also referred to as an amplifier transistor, in accordance with some embodiments.

The gate structure 137 is between the source/drain structures 117e and 117f, in accordance with some embodiments. The gate structure 137 and the source/drain structures 117e and 117f together form a select transistor TR7, in accordance with some embodiments.

The isolation structure 120 surrounds the light-sensing structures 116a, 116b, 116c, and 116d and the source/drain structures 117a, 117b, 117c, 117d, 117e, and 117f, in accordance with some embodiments. In some embodiments, the source/drain structures 117a, 117b, 117c, 117d, 117e, and 117f are formed by implanting dopants into the substrate 110 from the front surface 111 of the substrate 110. In some embodiments, the source/drain structures 117a, 117b, 117c, 117d, 117e, and 117f are formed by recessing the substrate 110 to form recesses in the substrate 110 and epitaxial growing strained materials in the recesses.

Figure 1B:
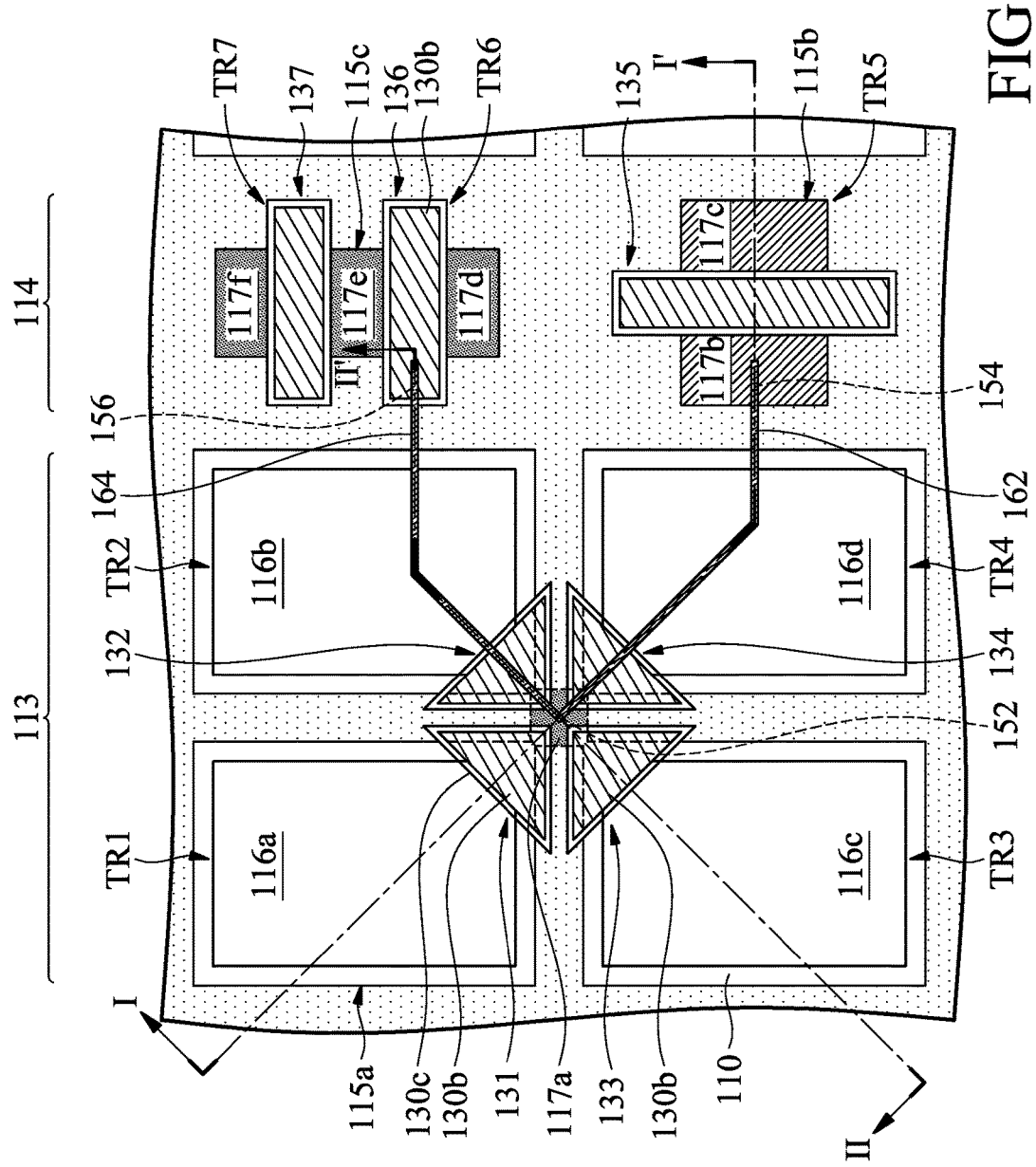
Figures 1, 1B:
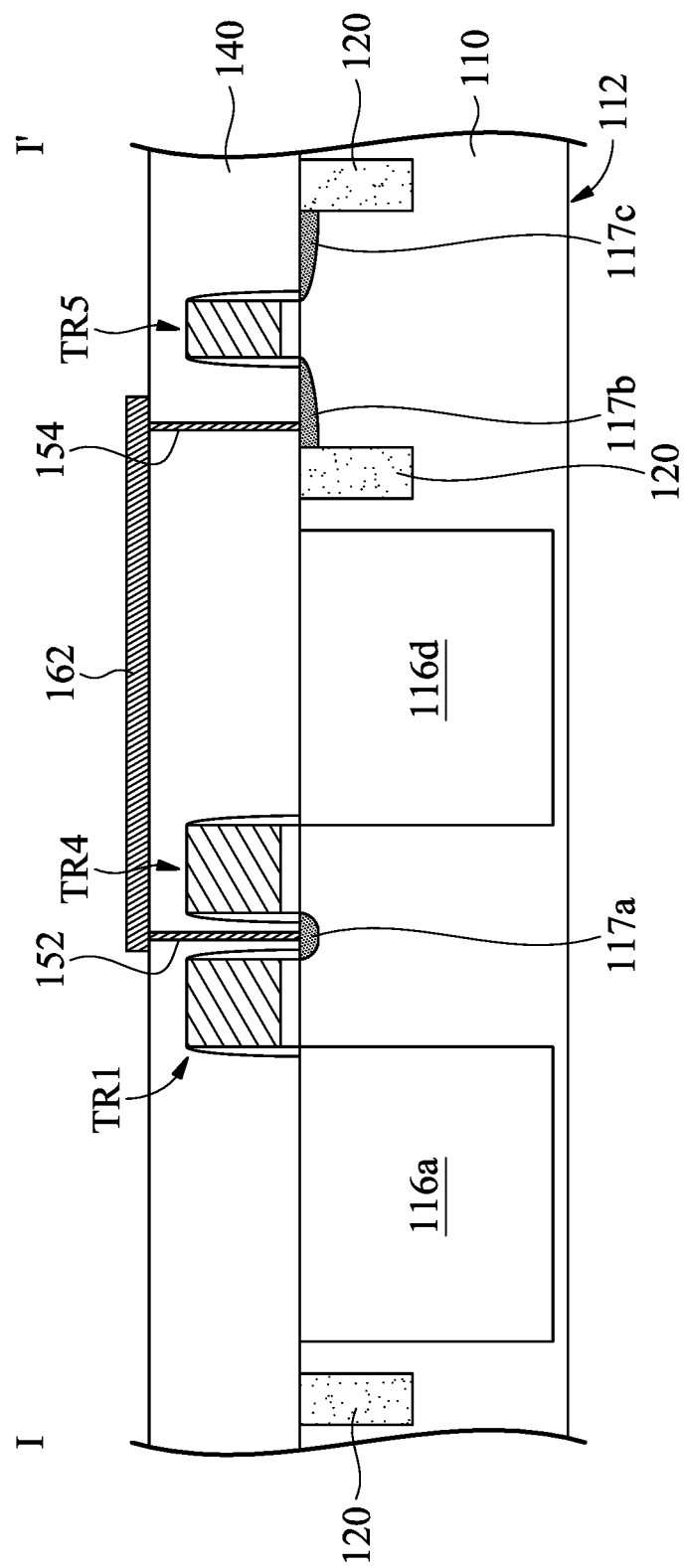
Figures 1, 1B, 2:
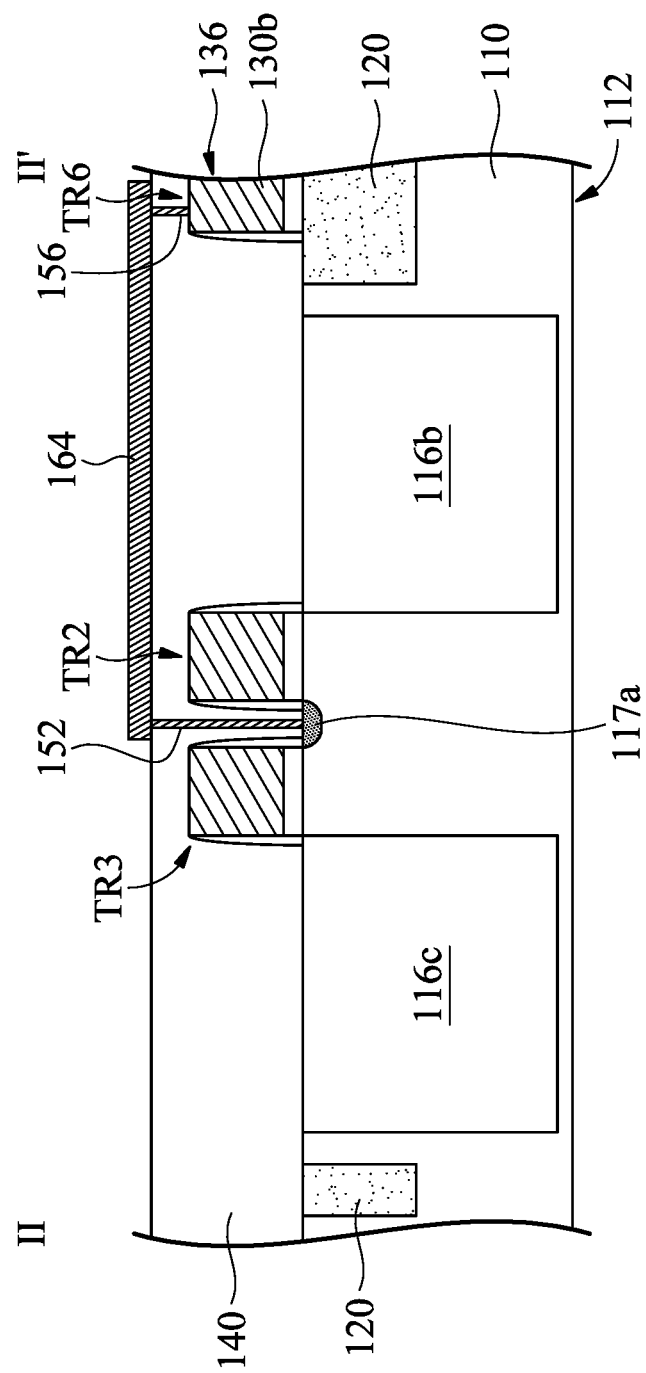

FIG. 1B-1 is a cross-sectional view illustrating the image sensor device along a sectional line I-I' in FIG. 1B, in accordance with some embodiments. FIG. 1B-2 is a cross-sectional view illustrating the image sensor device along a sectional line II-II' in FIG. 1B, in accordance with some embodiments.

As shown in FIGS. 1B-1 and 1B-2, a dielectric layer 140 is formed over the substrate 110, the isolation structure 120, the transistors TR1, TR2, TR3, and TR4, the reset transistor TR5, the source-follower transistor TR6, and the select transistor TR7, in accordance with some embodiments. The dielectric layer 140 is made of silicon dioxide, silicon nitride, silicon oxynitride, fluoride-doped silicate glass (FSG), a low-K dielectric material, another suitable insulating material, or combinations thereof.

The dielectric layer 140 is formed using a deposition process, such as a chemical vapor deposition process, a physical vapor deposition process, or another suitable deposition process. For the sake of simplicity, FIG. 1B does not show the dielectric layer 140.

As shown in FIGS. 1B, 1B-1, and 1B-2, conductive plugs 152, 154, and 156 are formed in the dielectric layer 140 and pass through the dielectric layer 140, in accordance with some embodiments. The conductive plugs 152, 154, and 156 are respectively and electrically connected to the source/drain structures 117a and 117b and the gate electrode 130b of the gate structure 136, in accordance with some embodiments.

The conductive plugs 152, 154, and 156 are made of a conductive material, such as a metal material (e.g., copper, aluminum, tungsten, gold, platinum, cobalt, another suitable metal, an alloy thereof, or a combination thereof), in accordance with some embodiments.

As shown in FIGS. 1B, 1B-1, and 1B-2, conductive lines 162 and 164 are formed over the dielectric layer 140, in accordance with some embodiments. The conductive line 162 electrically connects the conductive plug 152 (or the source/drain structure 117a) to the conductive plug 154 (or the source/drain structure 117b), in accordance with some embodiments. The conductive line 164 electrically connects the conductive plug 152 (or the source/drain structure 117a) to the conductive plug 156 (or the gate electrode 130b of the gate structure 136), in accordance with some embodiments.

The conductive lines 162 and 164 are made of a conductive material, such as a metal material (e.g., copper, aluminum, tungsten, gold, platinum, cobalt, another suitable metal, an alloy thereof, or a combination thereof), in accordance with some embodiments.

Figure 1C:
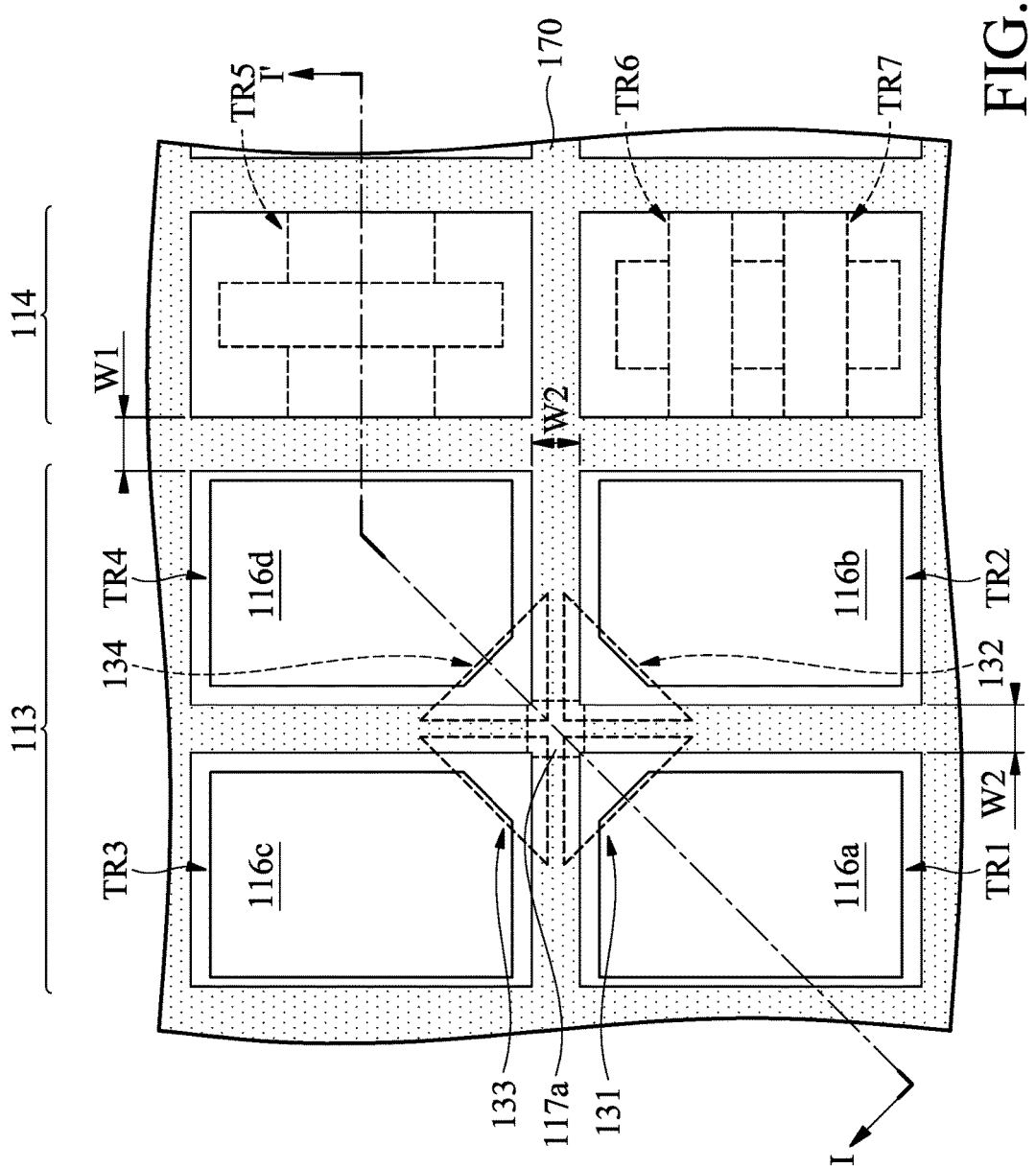
Figures 1, 1C:
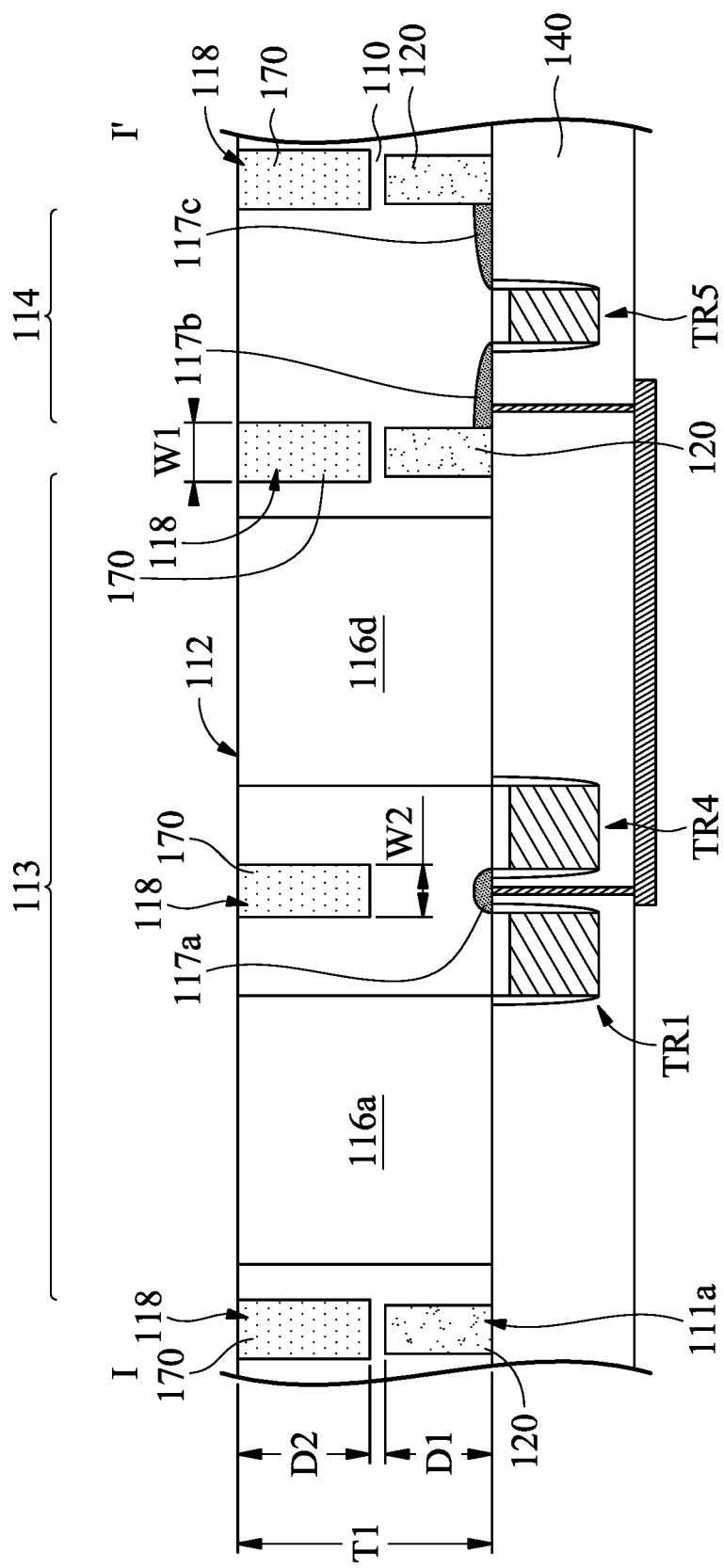

FIG. 1C-1 is a cross-sectional view illustrating the image sensor device along a sectional line I-I' in FIG. 1C, in accordance with some embodiments. Thereafter, as shown in FIGS. 1B-1 and 1C-1, a thinning process is performed to thin the substrate 110 from the back surface 112, in accordance with some embodiments. The thinning process may include a chemical mechanical polishing process. Afterwards, as shown in FIGS. 1C and 1C-1, the substrate 110 is flipped over, in accordance with some embodiments.

Thereafter, as shown in FIGS. 1C and 1C-1, a portion of the substrate 110 is removed to form a trench 118 in the substrate 110, in accordance with some embodiments. The trench 118 extends from the back surface 112 into the substrate 110, in accordance with some embodiments.

The trench 118 has a depth D2, in accordance with some embodiments. In some embodiments, a ratio of the depth D2 to the thickness T1 of the substrate 110 ranges from about 0.2 to about 0.8. In some embodiments, the ratio of the depth D2 to the thickness T1 ranges from about 0.6 to about 0.8. In some embodiments, the depth D2 is greater than the depth D1 of the trench 111a.

Afterwards, as shown in FIGS. 1C and 1C-1, an isolation structure 170 is formed in the trench 118, in accordance with some embodiments. The isolation structure 170 extends from the back surface 112 into the substrate 110, in accordance with some embodiments.

The isolation structure 170 is between the light-receiving region 113 (or the light-sensing structures 116a, 116b, 116c, and 116d) and the device region 114 (or the reset transistor TR5, the source-follower transistor TR6, and the select transistor TR7), in accordance with some embodiments. The isolation structure 170 surrounds the entire device region 114 to separate the device region 114 from the light-receiving region 113, in accordance with some embodiments.

The isolation structure 170 continuously surrounds the entire reset transistor TR5, the entire source-follower transistor TR6, and the entire select transistor TR7, in accordance with some embodiments. The isolation structure 170 is between the reset transistor TR5 and the source-follower transistor TR6 (or the select transistor TR7), in accordance with some embodiments.

The isolation structure 170 surrounding the device region 114 (or the isolation structure 170 between the device region 114 and the light-receiving region 113) has a width W1, in accordance with some embodiments. The isolation structure 170 surrounds each of the light-sensing structures 116a, 116b, 116c, and 116d, in accordance with some embodiments. The isolation structure 170 between each two adjacent light-sensing structures 116a, 116b, 116c, and 116d has a width W2, in accordance with some embodiments. The width W1 is greater than the width W2, in accordance with some embodiments.

The isolation structure 170 is made of a light blocking material to absorb or reflect incident light. Therefore, the isolation structure 170 is able to prevent incident light arriving the light-receiving region 113 from entering the device region 114. As a result, the isolation structure 170 prevents devices (e.g., the reset transistor TR5, the source-follower transistor TR6, or the select transistor TR7) formed in the device region 114 from being affected by incident light. Therefore, the isolation structure 170 improves the performance and the reliability of the devices (e.g., the reset transistor TR5, the source-follower transistor TR6, or the select transistor TR7) formed in the device region 114.

The isolation structure 170 is between each two adjacent light-sensing structures 116a, 116b, 116c, and 116d, in accordance with some embodiments. The isolation structure 170 surrounds each of the entire light-sensing structures 116a, 116b, 116c, and 116d, in accordance with some embodiments. In some embodiments, a portion of the isolation structure 170 is directly over the source/drain structure 117a.

In some embodiments, the isolation structure 170 includes a light reflection structure. In some embodiments, the light reflection structure has a lower refractive index than that of the substrate 110, and therefore a portion of the incident light arriving at the light reflection structure is reflected, which is a phenomenon called "total internal reflection". The light reflection structure includes dielectric materials, such as silicon dioxides, silicon nitrides, or silicon carbides.

Alternatively, in some embodiments, the isolation structure 170 includes a light absorption structure. In some embodiments, the light absorption structure has a light absorptivity ranging from about 60% to about 100%. In some embodiments, the light absorption structure is used to absorb the incident light arriving at the light absorption structure.

In some embodiments, the light absorption structure includes a polymer material (e.g., an opaque polymer material). In some embodiments, the light absorption structure includes a non-visible light filter (e.g. an IR filter or a UV filter) enabled to block visible light and transmit non-visible light.

Figure 1D:
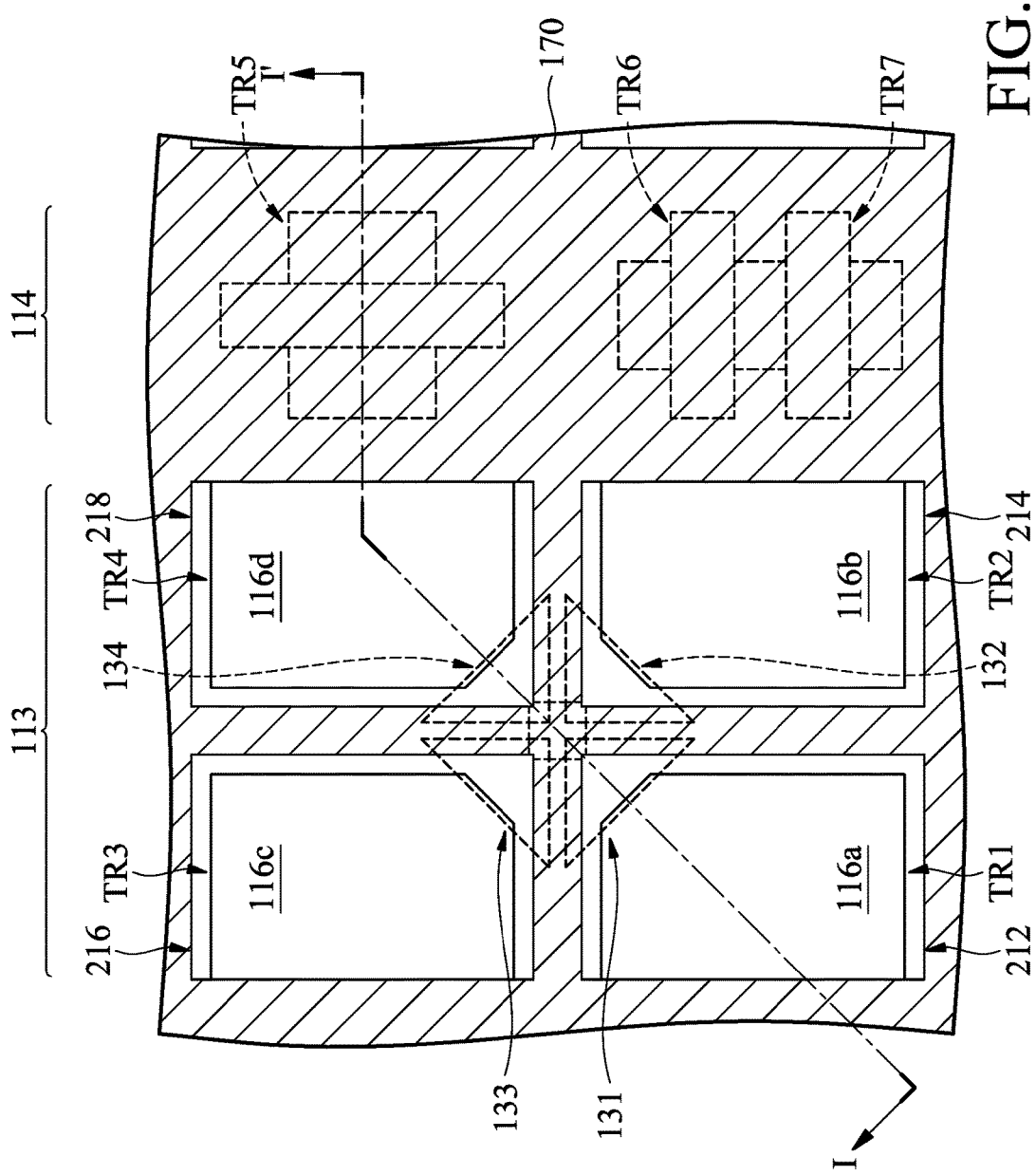
Figures 1, 1D:
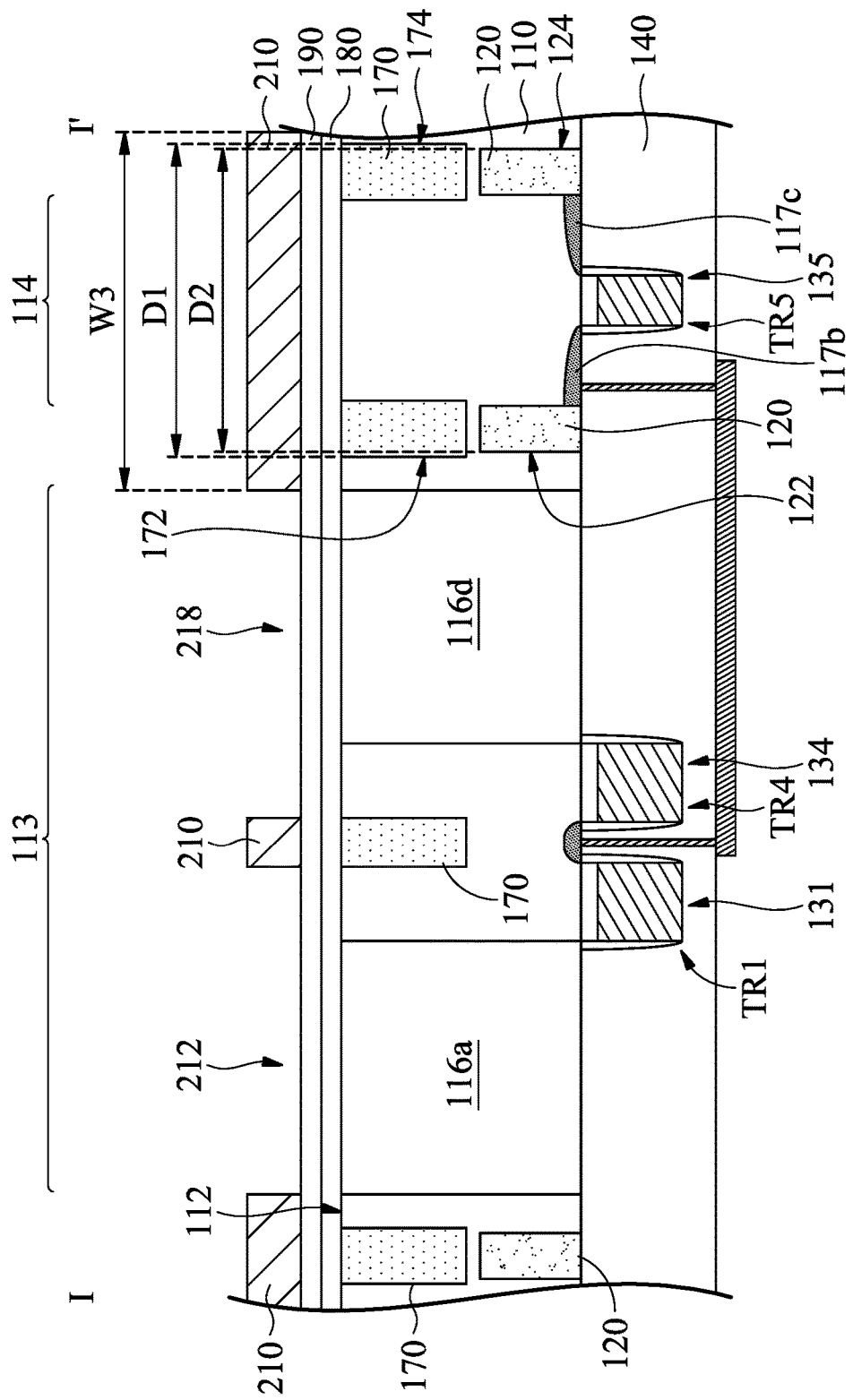

Thereafter, as shown in FIGS. 1D and 1D-1, an anti-reflection coating (ARC) layer 180 and a buffer layer 190 are sequentially formed over the back surface 112 of the substrate 110, in accordance with some embodiments. The ARC layer 180 is used to reduce optical reflection from the back surface 112 of the substrate 110 to ensure that most of an incident light enters the light-sensing structures 116a, 116b, 116c, and 116d and is sensed.

The ARC layer 180 may be made of a high-k material, a dielectric material, other applicable materials, or a combination thereof. The high-k material may include hafnium oxide, tantalum pentoxide, zirconium dioxide, aluminum oxide, other suitable materials, or a combination thereof. The dielectric material includes, for example, silicon nitride, silicon oxynitride, other suitable materials, or a combination thereof.

The buffer layer 190 is used as a buffer between the ARC layer 180 and subsequently formed overlying layers. The buffer layer 190 may be made of a dielectric material or other suitable materials. For example, the buffer layer 190 is made of silicon dioxide, silicon nitride, silicon oxynitride, other applicable materials, or a combination thereof.

FIG. 1D-1 is a cross-sectional view illustrating the image sensor device along a sectional line I-I' in FIG. 1D, in accordance with some embodiments. Thereafter, as shown in FIGS. 1D and 1D-1, a light-blocking layer 210 is formed over the buffer layer 190, in accordance with some embodiments. The light-blocking layer 210 has openings 212, 214, 216, and 218, in accordance with some embodiments. The openings 212, 214, 216, and 218 are directly over the light-sensing structures 116a, 116b, 116c, and 116d, respectively, in accordance with some embodiments.

The light-blocking layer 210 covers the entire reset transistor TR5, in accordance with some embodiments. The light-blocking layer 210 covers the entire source-follower transistor TR6 and the entire select transistor TR7, in accordance with some embodiments. The light-blocking layer 210 covers the entire device region 114, in accordance with some embodiments. Therefore, the light-blocking layer 210 prevents incident light from entering the device region 114.

The light-blocking layer 210 prevents the devices (e.g., the reset transistor TR5, the source-follower transistor TR6, and the select transistor TR7) formed in the device region 114 from being affected by incident light. Therefore, the performance and the reliability of the devices formed in the device region 114 are improved by the light-blocking layer 210.

The light-blocking layer 210 covers the entire source/drain structure 117a, in accordance with some embodiments. Therefore, the light-blocking layer 210 prevents incident light from entering and affecting the source/drain structure 117a. The light-blocking layer 210 covers the gate structures 131, 132, 133, and 134, in accordance with some embodiments. The light-blocking layer 210 covers the isolation structure 170, in accordance with some embodiments.

The light-blocking layer 210 covering the device region 114 has a width W3, in accordance with some embodiments. The isolation structure 170 surrounding the device region 114 has a first sidewall 172 and a second sidewall 174 opposite to the first sidewall 172, in accordance with some embodiments. The width W3 is greater than a distance D1 between the first sidewall 172 and the second sidewall 174, in accordance with some embodiments.

The isolation structure 120 surrounding the device region 114 has a third sidewall 122 and a fourth sidewall 124 opposite to the third sidewall 122, in accordance with some embodiments. The width W3 is greater than a distance D2 between the third sidewall 122 and the fourth sidewall 124, in accordance with some embodiments. In some embodiments, a ratio of the width W3 to the distance D2 ranges from about 1.05 to about 1.2.

The light-blocking layer 210 is between each two adjacent light-sensing structures 116a, 116b, 116c, and 116d, in accordance with some embodiments. The light-blocking layer 210 surrounds each of the entire light-sensing structures 116a, 116b, 116c, and 116d, in accordance with some embodiments. The light-blocking layer 210 is used to prevent incident light from entering a neighboring light-sensing structure 116a, 116b, 116c, or 116d. The crosstalk problems between the light-sensing structures 116a, 116b, 116c, and 116d are thus prevented or reduced.

In some embodiments, the light-blocking layer 210 is made of a reflective material such as a metal material. The light-blocking layer 210 may be made of aluminum, silver, copper, titanium, platinum, tungsten, tantalum, tantalum nitride, other suitable materials, or a combination thereof. In some embodiments, the light-blocking layer 210 is formed over the buffer layer 190 using a suitable process. The suitable process includes, for example, a PVD process, an electroplating process, a CVD process, other applicable processes, or a combination thereof.

Figure 1E:
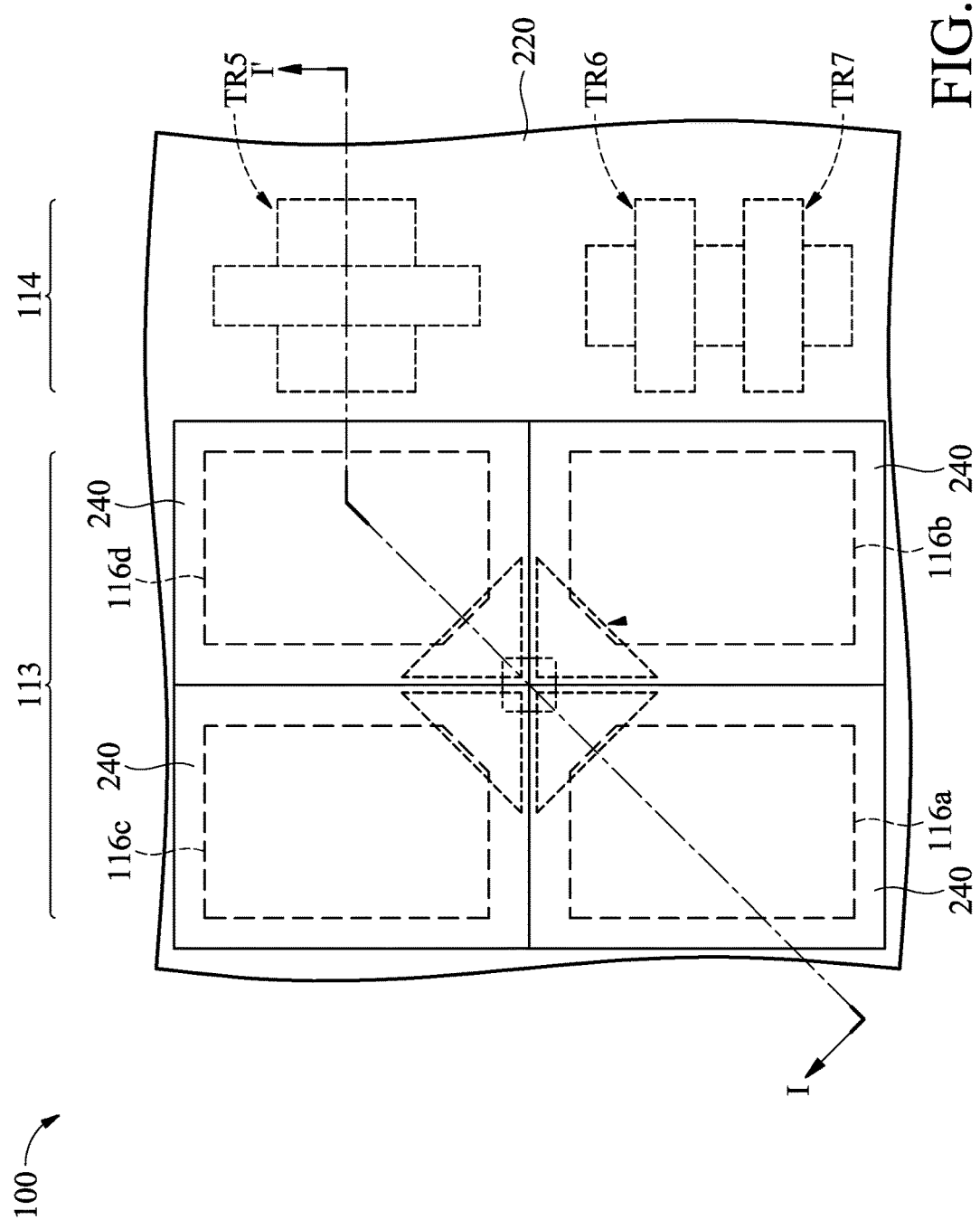
Figures 1, 1E:
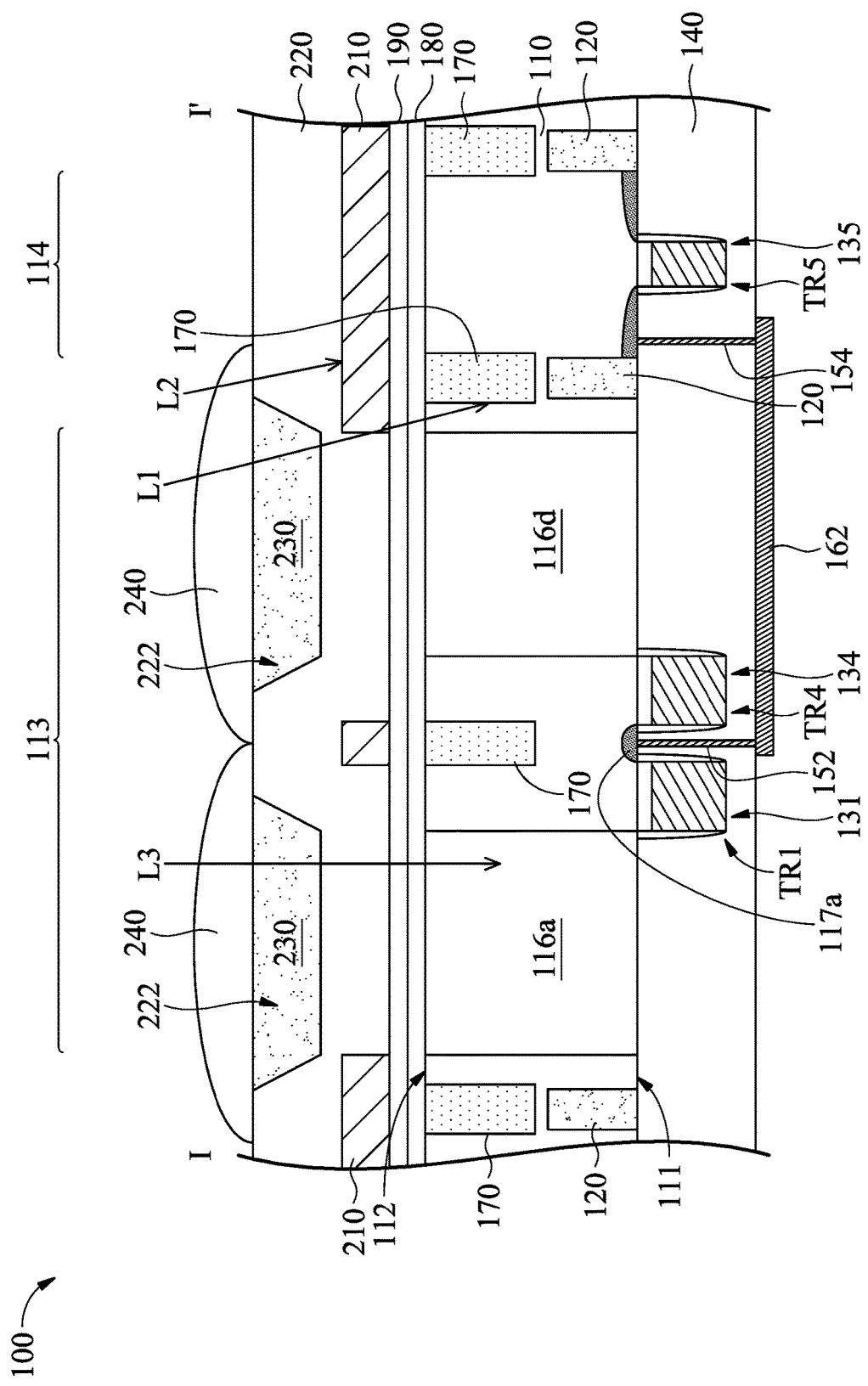
Figure 2:
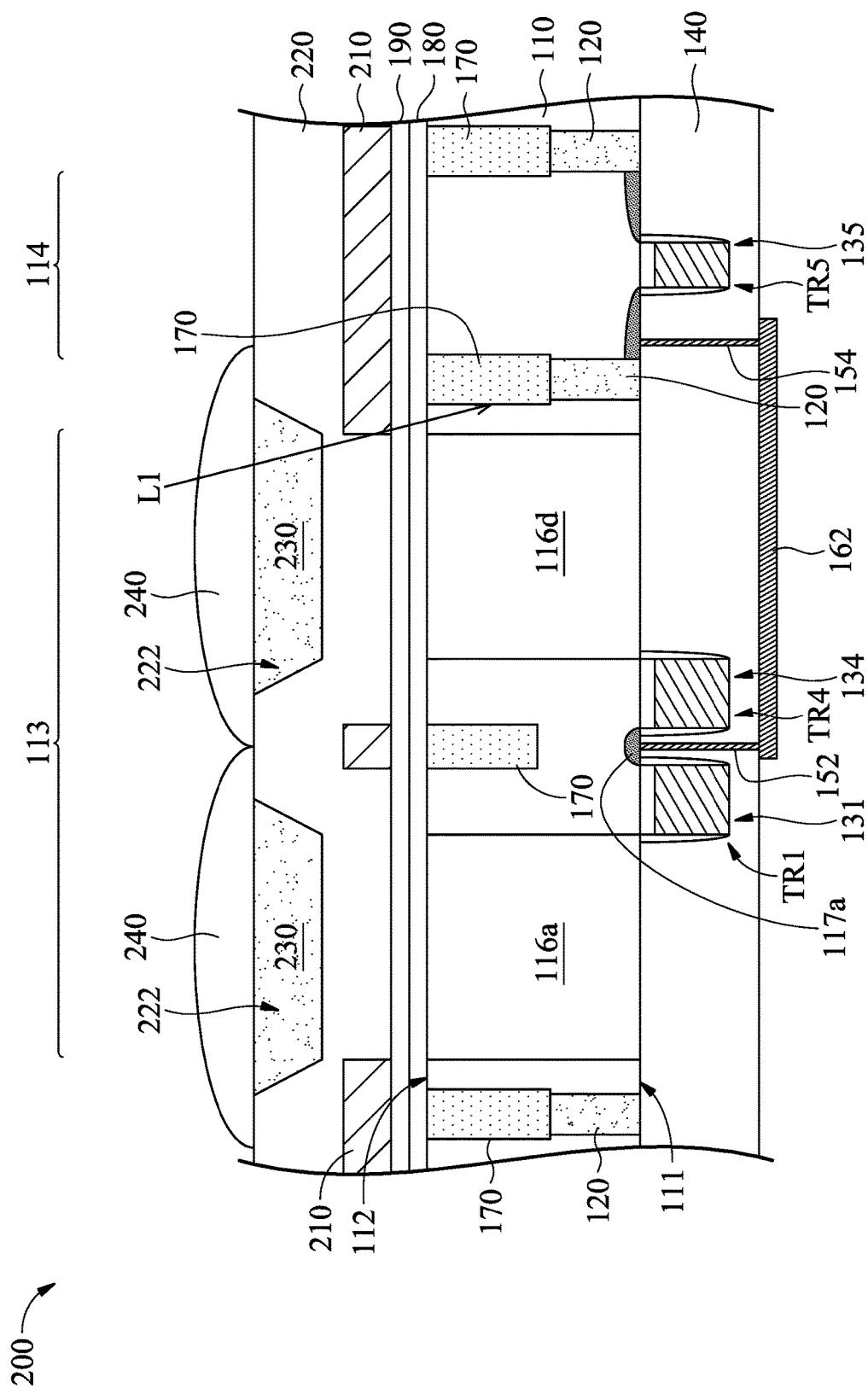
Figure 3:
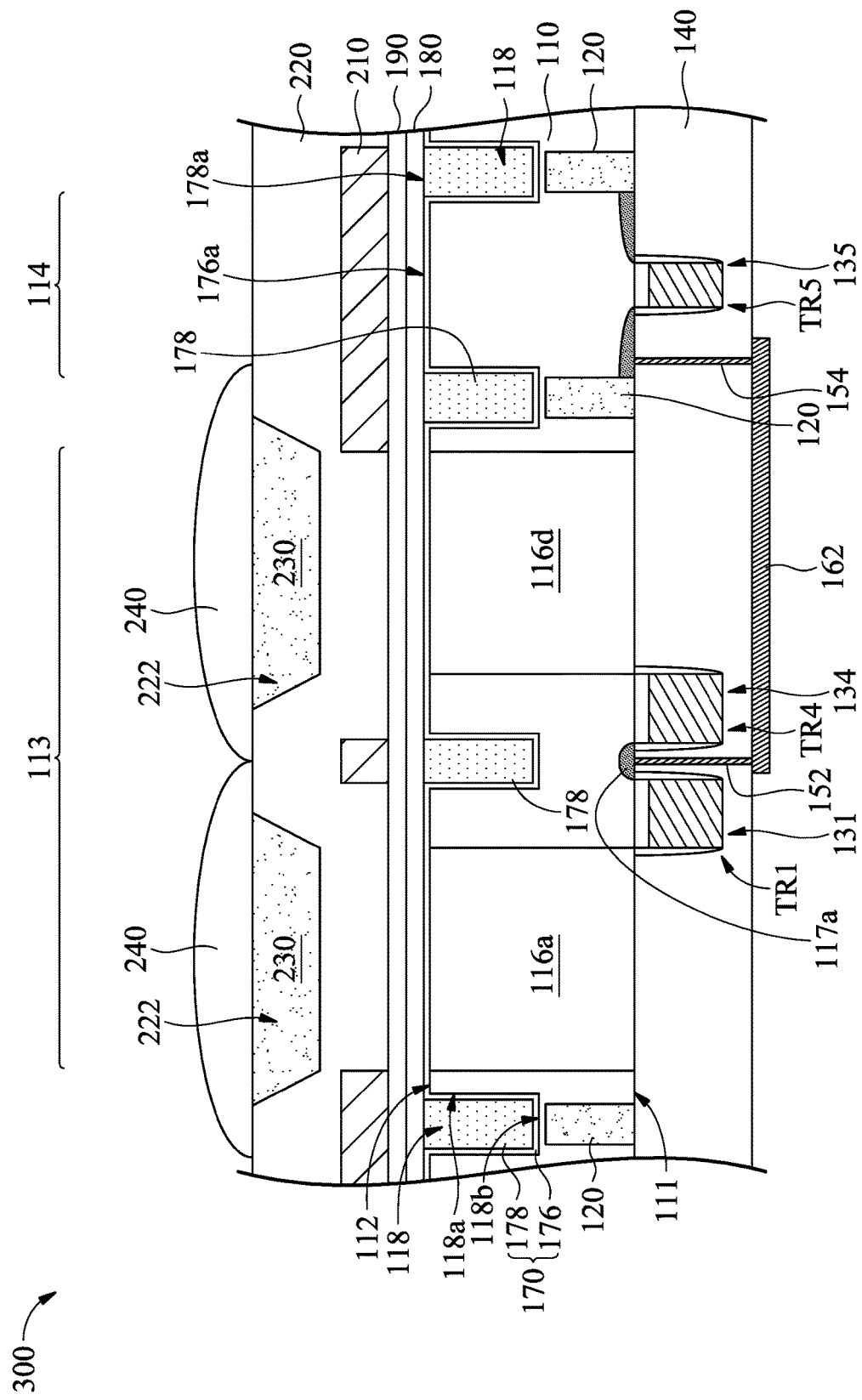

FIG. 1E-1 is a cross-sectional view illustrating the image sensor device along a sectional line I-I' in FIG. 1E, in accordance with some embodiments. Afterwards, as shown in FIGS. 1E and 1E-1, a dielectric layer 220 is formed over the buffer layer 190 to cover the light-blocking layer 210, in accordance with some embodiments.

The dielectric layer 220 may be made of silicon dioxide, silicon nitride, silicon oxynitride, or other suitable materials. The dielectric layer 220 is formed by a CVD process or another suitable process. The dielectric layer 220 has multiple recesses 222, in accordance with some embodiments. The recesses 222 are directly over the light-sensing structures 116a, 116b, 116c, and 116d, respectively, in accordance with some embodiments.

Thereafter, as shown in FIGS. 1E and 1E-1, visible light filters (such as color filters) 230 are formed in the recesses 222 respectively. In some embodiments, the visible light filters 230 are used to filter through visible light, such as red light, green light, and blue light. In some embodiments, the light-blocking layer 210 and the isolation structure 170 include a non-visible light filter (e.g. an IR filter or a UV filter) enabled to block the visible light passing though the visible light filters 230.

Afterwards, as shown in FIGS. 1E and 1E-1, lenses 240 are respectively formed over the visible light filters 230, in accordance with some embodiments. The lenses 240 are used to direct or focus the incident light. The lenses 240 may include a microlens array.

The lenses 240 may be made of a high transmittance material. For example, the high transmittance material includes transparent polymer material (such as polymethylmethacrylate, PMMA), transparent ceramic material (such as glass), other applicable materials, or a combination thereof. In this step, an image sensor device 100 is substantially formed, in accordance with some embodiments.

As shown in FIG. 1E-1, an incident light L1 passing through the visible light filter 230 and arriving at the isolation structure 170 may be absorbed or reflected by the isolation structure 170, in accordance with some embodiments. As shown in FIG. 1E-1, an incident light L2 passing through the visible light filter 230 and arriving at the light-blocking layer 210 may be absorbed or reflected by the light-blocking layer 210, in accordance with some embodiments. Therefore, the light-blocking layer 210 and the isolation structure 170 may prevent incident light from entering the device region 114.

As shown in FIG. 1E-1, an incident light L3 passes through the visible light filter 230 and enters the light-sensing structure 116a (or the light-sensing structure 116b, 116c, or 116d), in accordance with some embodiments. The incident light L3 generates electron-hole pairs in the light-sensing structure 116a, in accordance with some embodiments. The holes may be trapped by a doped layer (not shown) over the back surface 112 of the substrate 110 to prevent the re-combination of the electrons and the holes.

The electrons are transferred from the light-sensing structure 116a to the source/drain structure 117a when the gate structure (or the transfer gate structure) 131 is turned on, in accordance with some embodiments. Through the connection of the conductive plugs 152 and 156 and the conductive line 164 (as shown in FIGS. 1B and 1B-2), the source-follower transistor TR6 may convert the electrons from the source/drain structure 117a into voltage signals.

The select transistor TR7 may allow a single row (or a single column) of a pixel array to be read by read-out electronics. The reset transistor TR5 may act as a switch to reset the source/drain structure 117a. When the reset transistor TR5 is turned on, the source/drain structure 117a is electrically connected to a power supply to clear all accumulated electrons.

FIG. 2 is a cross-sectional view illustrating an image sensor device 200, in accordance with some embodiments. As shown in FIG. 2, the image sensor device 200 is similar to the image sensor device 100 of FIGS. 1E and 1E-1, except that the isolation structure 170 of the image sensor device 200 is in direct contact with the isolation structure 120 thereunder, in accordance with some embodiments.

Furthermore, since the isolation structure 170 is in direct contact with the isolation structure 120 thereunder, the isolation structures 120 and 170 together completely separate the light-receiving region 113 (or the light-sensing structures 116a, 116b, 116c, and 116d) from the device region 114 (or the reset transistor TR5, the source-follower transistor TR6, and the select transistor TR7), in accordance with some embodiments. As a result, the isolation structures 120 and 170 may prevent the incident light L1 from entering into the device region 114.

FIG. 3 is a cross-sectional view illustrating an image sensor device 300, in accordance with some embodiments. As shown in FIG. 3, the image sensor device 300 is similar to the image sensor device 100 of FIGS. 1E and 1E-1, except that the isolation structure 170 of the image sensor device 300 includes an insulating layer 176 and a light-blocking structure 178, in accordance with some embodiments.

The insulating layer 176 conformally covers the back surface 112 and inner walls 118a and a bottom surface 118b of the trench 118, in accordance with some embodiments. The insulating layer 176 is also referred to as a liner layer, in accordance with some embodiments. In some embodiments, the insulating layer 176 is used to passivate the back surface 112, the inner walls 118a, and the bottom surface 118b.

The insulating layer 176 is made of silicon dioxide, in accordance with some embodiments. The insulating layer 176 includes a high-k material, a dielectric material, or other suitable insulating materials. The high-k material may include hafnium oxide, tantalum pentoxide, zirconium dioxide, aluminum oxide, other suitable materials, or a combination thereof.

The dielectric material includes, for example, silicon nitride, silicon oxynitride, other suitable materials, or a combination thereof. The insulating layer 176 is formed by, for example, a thermal oxidation process or a deposition process, such as a chemical vapor deposition process or a physical vapor deposition process.

The light-blocking structure 178 is formed over the insulating layer 176 in the trench 118, in accordance with some embodiments. The trench 118 is filled with the insulating layer 176 and the light-blocking structure 178, in accordance with some embodiments. A top surface 176a of the insulating layer 176 and a top surface 178a of the light-blocking structure 178 are substantially coplanar, in accordance with some embodiments.

The light-blocking structure 178 has a light reflectivity ranging from about 60% to about 100%, in accordance with some embodiments. The light-blocking structure 178 is made of a metal material or an alloy material, in accordance with some embodiments. The light-blocking structure 178 includes Al, W, Cu, Ti, an alloy thereof, a combination thereof, or another suitable reflective material.

In some embodiments, the light-blocking structure 178 includes a light absorption structure. In some embodiments, the light absorption structure has a light absorptivity ranging from about 60% to about 100%. The light-blocking structure 178 is made of a black silicon material or a semiconductor material with a band gap smaller than 1.5 eV (e.g., Ge, InSb, or InAs), in accordance with some embodiments.

Figure 4:
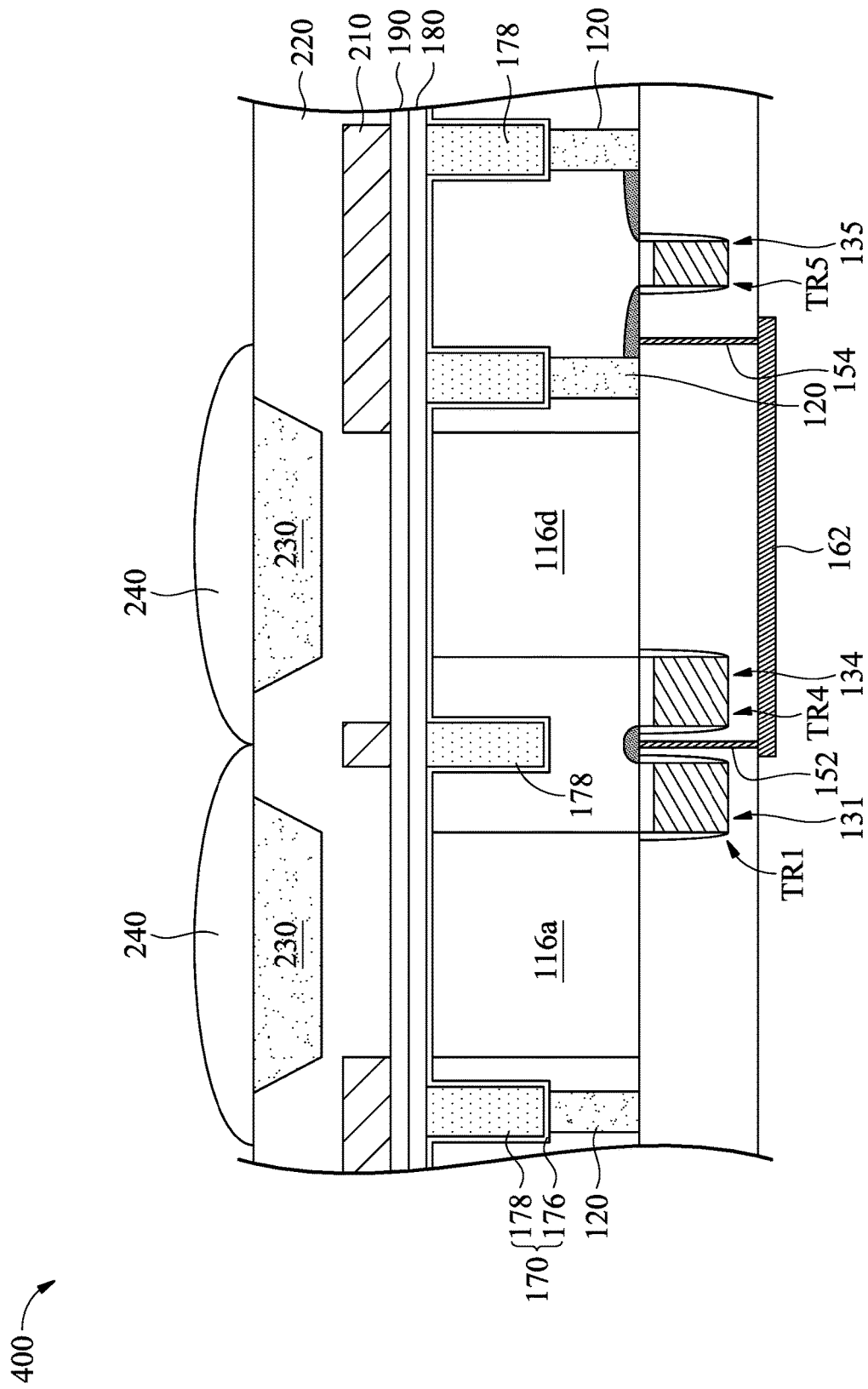
FIG. 4 is a cross-sectional view illustrating an image sensor device, in accordance with some embodiments.

FIG. 4 is a cross-sectional view illustrating an image sensor device 400, in accordance with some embodiments. As shown in FIG. 4, the image sensor device 400 is similar to the image sensor device 300 of FIG. 3, except that the insulating layer 176 of the isolation structure 170 of the image sensor device 400 is in direct contact with the isolation structure 120 thereunder, in accordance with some embodiments. In some embodiments, the light-blocking layer 210 covers the entire gate structures 131, 132, 133, 134.

In accordance with some embodiments, image sensor devices and methods for forming the same are provided. The methods (for forming the image sensor device) form a light-blocking layer over a back surface of a semiconductor substrate to cover a first source/drain structure formed in the semiconductor substrate. The first source/drain structure is electrically connected to a second source/drain structure of a transistor. The transistor includes a light-sensing structure. The light-blocking layer prevents incident light from reaching and affecting the first source/drain structure. The methods further form an isolation structure extending from the back surface into the semiconductor substrate and surrounding the first source/drain structure. The isolation structure prevents incident light from reaching and affecting the first source/drain structure.

In accordance with some embodiments, a method for forming an image sensor device is provided. The method includes providing a substrate. The substrate has a front surface and a back surface, and the substrate has a light-receiving region and a device region. The method includes forming a first transistor and a first source/drain structure respectively in the light-receiving region and the device region. The first transistor includes a first gate structure, a light-sensing structure, a second source/drain structure, the first gate structure is over the front surface, the light-sensing structure and the second source/drain structure are formed in the substrate and are respectively located at opposite first sides of the first gate structure, the first source/drain structure is formed in the substrate, and the first source/drain structure is electrically connected to the second source/drain structure. The method includes forming a light-blocking layer over the back surface. The light-blocking layer covers the entire first source/drain structure.

In accordance with some embodiments, a method for forming an image sensor device is provided. The method includes providing a substrate. The substrate has a front surface and a back surface, and the substrate has a light-receiving region and a device region. The method includes forming a transistor and a first source/drain structure respectively in the light-receiving region and the device region. The transistor includes a first gate structure, a light-sensing structure, a second source/drain structure. The first gate structure is over the front surface. The light-sensing structure and the second source/drain structure are formed in the substrate and are respectively located at opposite first sides of the first gate structure. The first source/drain structure is formed in the substrate. The first source/drain structure is electrically connected to the second source/drain structure. The method includes forming a first isolation structure in the substrate. The first isolation structure extends from the back surface into the substrate, and the first isolation structure surrounds the device region to separate the device region from the light-receiving region.

In accordance with some embodiments, an image sensor device is provided. The image sensor device includes a substrate having a front surface and a back surface. The substrate has a light-receiving region and a device region. The image sensor device includes a transistor in the light-receiving region. The transistor includes a first gate structure, a light-sensing structure, and a first source/drain structure. The first gate structure is over the front surface. The light-sensing structure and the first source/drain structure are in the substrate and are respectively located at opposite first sides of the first gate structure. The image sensor device includes a second source/drain structure over the front surface and in the device region. The first source/drain structure is electrically connected to the second source/drain structure. The image sensor device includes a light-blocking layer over the back surface. The light-blocking layer covers the entire second source/drain structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an image sensor device, comprising:
   providing a substrate, wherein the substrate has a front surface and a back surface, the back surface of the substrate is a light-receiving surface, and the substrate has a light-receiving region and a device region;
   forming a first transistor and a first source/drain structure respectively in the light-receiving region and the device region, wherein the first transistor comprises a first gate structure, a light-sensing structure, a second source/drain structure, the first gate structure is over the front surface, the light-sensing structure and the second source/drain structure are formed in the substrate and are respectively located at opposite first sides of the first gate structure, the first source/drain structure is formed in the substrate, and the first source/drain structure is electrically connected to the second source/drain structure; and
   forming a light-blocking layer over the back surface, wherein the light-blocking layer covers the entire first source/drain structure, and the light-blocking layer partially covers the back surface of the substrate.

2. The method for forming the image sensor device as claimed in claim 1, further comprising:
   during the forming of the first transistor and the first source/drain structure, forming a second gate structure and a third source/drain structure,
   wherein the second gate structure is formed over the front surface and in the device region, the third source/drain structure is formed in the device region, the first source/drain structure and the third source/drain structure are respectively located at opposite second sides of the second gate structure, and the second gate structure, the first source/drain structure, and the third source/drain structure together form a second transistor.

3. The method for forming the image sensor device as claimed in claim 2, wherein the light-blocking layer further covers the entire second gate structure and the entire third source/drain structure.

4. The method for forming the image sensor device as claimed in claim 1, wherein the light-blocking layer further covers the entire second source/drain structure.

5. The method for forming the image sensor device as claimed in claim 4, wherein the light-blocking layer further covers the first gate structure.

6. The method for forming the image sensor device as claimed in claim 1, further comprising:
after the forming of the first transistor and the first source/drain structure and before the forming of the light-blocking layer, forming a first isolation structure in the substrate, wherein the first isolation structure extends from the back surface into the substrate, and the first isolation structure surrounds the first source/drain structure.

7. The method for forming the image sensor device as claimed in claim 6, further comprising:
before the forming of the first transistor and the first source/drain structure, forming a second isolation structure in the substrate, wherein the second isolation structure extends from the front surface into the substrate, and the second isolation structure surrounds the light-sensing structure, the second source/drain structure, and the first source/drain structure.

8. A method for forming an image sensor device, comprising:
providing a substrate, wherein the substrate has a front surface and a back surface, the back surface of the substrate is a light-receiving surface, and the substrate has a light-receiving region and a device region;
forming a transistor and a first source/drain structure respectively in the light-receiving region and the device region, wherein the transistor comprises a gate structure, a light-sensing structure, and a second source/drain structure, the gate structure is over the front surface, the light-sensing structure and the second source/drain structure are formed in the substrate and are respectively located at opposite sides of the gate structure, the first source/drain structure is formed in the substrate, and the first source/drain structure is electrically connected to the second source/drain structure; and
forming a first isolation structure in the substrate, wherein the first isolation structure extends from the back surface into the substrate, and the first isolation structure surrounds the device region to separate the device region from the light-receiving region.

9. The method for forming the image sensor device as claimed in claim 8, wherein the first isolation structure surrounds the entire first source/drain structure.

10. The method for forming the image sensor device as claimed in claim 8, wherein the first isolation structure surrounds the entire light-sensing structure.

11. The method for forming the image sensor device as claimed in claim 8, wherein a portion of the first isolation structure is directly over the second source/drain structure.

12. The method for forming the image sensor device as claimed in claim 8, further comprising:
before the forming of the transistor and the first source/drain structure, forming a second isolation structure in the substrate, wherein the second isolation structure extends from the front surface into the substrate, and the second isolation structure surrounds the light-sensing structure, the second source/drain structure, and the first source/drain structure.

13. The method for forming the image sensor device as claimed in claim 8, further comprising:
after the forming of the first isolation structure, forming a light-blocking layer over the back surface, wherein the light-blocking layer covers the entire device region.

14. An image sensor device, comprising:
a substrate having a front surface and a back surface, wherein the substrate has a light-receiving region and a device region, and the back surface of the substrate is a light-receiving surface;
a transistor in the light-receiving region, wherein the transistor comprises a gate structure, a light-sensing structure, and a first source/drain structure, the gate structure is over the front surface, the light-sensing structure and the first source/drain structure are in the substrate and are respectively located at opposite sides of the gate structure;
a second source/drain structure in the substrate in the device region, wherein the first source/drain structure is electrically connected to the second source/drain structure; and
a light-blocking layer over the back surface, wherein the light-blocking layer covers the entire second source/drain structure, and the back surface of the substrate is between the light-blocking layer and the second source/drain structure.

15. The image sensor device as claimed in claim 14, further comprising:
a first isolation structure in the substrate, wherein the first isolation structure extends from the back surface into the substrate, and the first isolation structure surrounds the entire second source/drain structure.

16. The image sensor device as claimed in claim 15, wherein the first isolation structure surrounds the entire device region to separate the device region from the light-receiving region.

17. The image sensor device as claimed in claim 16, wherein the light-blocking layer covers the entire device region and the first isolation structure.

18. The image sensor device as claimed in claim 14, wherein the light-blocking layer further covers the first source/drain structure.

19. The image sensor device as claimed in claim 14, wherein the light-blocking layer is made of a metal material.

20. The image sensor device as claimed in claim 14, wherein the light-blocking layer partially covers the back surface of the substrate.

* * * * *